US006722003B2

(12) United States Patent
Dunn et al.

(10) Patent No.: US 6,722,003 B2
(45) Date of Patent: Apr. 20, 2004

(54) UNDERWATER WIDE-BAND ELECTROACOUSTIC TRANSDUCER AND PACKAGING METHOD

(75) Inventors: Sheng-Dong Dunn, Kaohsiung Hsien (TW); Chi-Zen Yeh, Tainan Hsien (TW); Jeng-Yow Jih, Tainan (TW)

(73) Assignee: Chung-Shan Institute of Science and Technology, Taoyuan (TW)

( * ) Notice: Subject to any disclaimer, the term of this patent is extended or adjusted under 35 U.S.C. 154(b) by 0 days.

(21) Appl. No.: 10/393,037

(22) Filed: Mar. 19, 2003

(65) Prior Publication Data

US 2003/0155843 A1 Aug. 21, 2003

Related U.S. Application Data

(62) Division of application No. 10/015,449, filed on Dec. 12, 2001.

(51) Int. Cl.$^7$ .......................... H04R 17/00; H01L 41/06

(52) U.S. Cl. ...................................... 29/25.35; 310/337

(58) Field of Search .......................... 310/337; 29/25.35

(56) References Cited

U.S. PATENT DOCUMENTS

| | | | | | |
|---|---|---|---|---|---|
| 3,182,284 | A | * | 5/1965 | Green | 310/369 |
| 3,833,825 | A | * | 9/1974 | Haan | 310/337 |
| 3,922,572 | A | * | 11/1975 | Cook et al. | 310/334 |
| 4,025,805 | A | * | 5/1977 | Coltman et al. | 310/335 |
| 4,439,847 | A | * | 3/1984 | Massa | 310/337 |

* cited by examiner

*Primary Examiner*—Nicholas Ponomarenko
*Assistant Examiner*—J. Aguirrechea
(74) *Attorney, Agent, or Firm*—J. C. Patents

(57) ABSTRACT

An underwater wide-band electroacoustic transducer and a method of packaging the transducer. The underwater wide-band electroacoustic transducer comprises of several groups of piezoelectric ceramic units and acoustic window material. To produce the underwater wide-band electroacoustic transducer, groups of piezoelectric ceramic units each having a different dimension are assembled such that each ceramic unit separates from each other by different distances. The frequency response of each ceramic unit groups are added together to provide a wide-band frequency response. The acoustic window material is injected to joins the ceramic unit groups together into a package.

5 Claims, 5 Drawing Sheets

UNDERWATER WIDE-BAND ELECTROACOUSTIC TRANSDUCER AND PACKAGING METHOD

CROSS-REFERENCE TO RELATED APPLICATION

This application is a divisional application of, and claims the priority benefit of, U.S. application Ser. No. 10/015,449 filed on Dec. 12, 2001.

BACKGROUND OF THE INVENTION

1. Field of Invention

The present invention relates to an electroacoustic transducer and a packaging method for the transducer. More particularly, the present invention relates to an underwater wide-band electroacoustic transducer and a packaging method for the transducer.

2. Description of Related Art

Typical active electroacoustic transducer has a tonpilz shape design. FIG. 1 is a schematic diagram showing the side view of a conventional tonpilz-shaped electroacoustic transducer. As shown in FIG. 1, the tonpilz-shaped transducer 100 consists of a plurality of identical dimension piezoelectric ceramic units 102. The piezoelectric ceramic units are chained together using prestress bolt (not shown). FIG. 2 is a graph showing the frequency response of the transducer in FIG. 1. As shown in FIG. 2, a tonpilz-shaped transducer comprising of a series of identical dimension piezoelectric ceramic units can have a single resonance frequency only. Hence, an assembly of identical dimension piezoelectric ceramic units 102 only works in a neighborhood close to the resonance frequency. In other words, the transducer has a narrow frequency bandwidth.

To improve the operating frequency of the tonpilz-shaped transducer 100, a matching layer 104 is often added to the front end of the transmitting surface. FIG. 3 is a schematic diagram showing the side view of a conventional tonpilz-shaped transducer having a matching layer thereon. The matching layer 104 at the front end of the transmitting surface serves to increase operating bandwidth. FIG. 4 is a graph showing the frequency response of the transducer shown in FIG. 3. As shown in FIG. 4, the frequency response has a few peaks. However, material for fabricating the matching layer 104 is difficult to find and the manufacturing process is generally complicated.

In general, a tonpilz-shaped transducer is a package assembled together using compressed rubber pieces. Hence, a relatively large compressive force is often required during the assembling process. However, the ceramic unit is usually formed by powder sintering method and thus has moderate strength only. The exertion of too much pressure may cause unnecessary damages to the piezoelectric ceramic units. Moreover, even an electroacoustic transducer design that incorporates a matching layer still fells short of the target of having an operating frequency bandwidth over several octaves.

SUMMARY OF THE INVENTION

Accordingly, one object of the present invention is to provide an underwater wide-band electroacoustic transducer and a packaging method for the transducer. The transducer includes several groups of piezoelectric ceramic units each having a different resonance frequency whose distance of separation is finely adjusted for maximum bandwidth. Moreover, injection-molding method replaces direct compression of rubber during component assembly.

To achieve these and other advantages and in accordance with the purpose of the invention, as embodied and broadly described herein, the invention provides an underwater wide-band electroacoustic transducer. The electroacoustic transducer includes several groups of piezoelectric ceramic units and an acoustic plastic. Each group of piezoelectric ceramic units has a different dimension and separates from a neighboring group by a different distance. Each group of piezoelectric ceramic units contributes a frequency response curve so that together they constitute a frequency response curve with a wide bandwidth. The acoustic plastic is used as an injection-molding compound for joining various piezoelectric ceramic units together into a package.

This invention also provides a method of assembling an underwater wide-band electroacoustic transducer. The underwater wide-band electroacoustic transducer comprises of several groups of piezoelectric ceramic units and acoustic window material. To produce the underwater wide-band electroacoustic transducer, groups of piezoelectric ceramic units each having a different dimension are assembled with each ceramic unit separated from each other by different distances. The frequency response of each ceramic unit groups are banded together to produce a package having a wide-band frequency response. The acoustic window material is injected to join the ceramic unit groups together into a package. Thus, groups of ceramic units each having a different dimension and distance of separation from their neighboring groups are assembled into a package having a wide-band frequency response.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
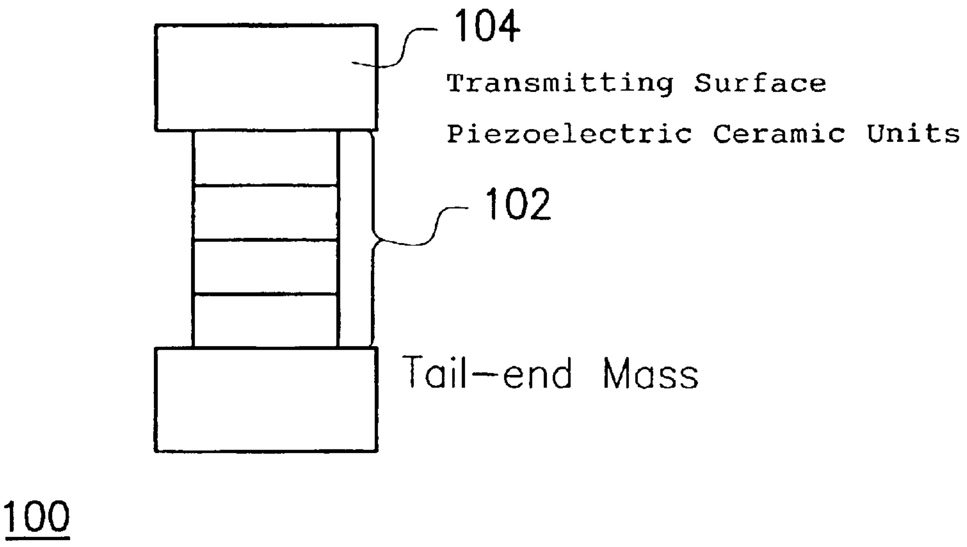
FIG. 1 (PRIOR ART)
FIG. 1 is a schematic diagram showing the side view of a conventional tonpilz-shaped electroacoustic transducer.
Figure 2:
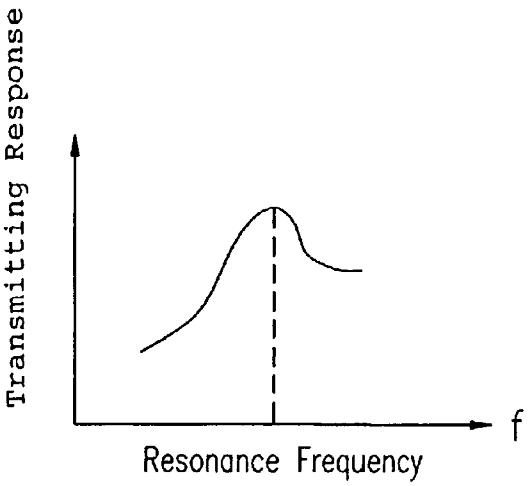
FIG. 2 (PRIOR ART)
FIG. 2 is a graph showing the frequency response of the transducer in FIG. 1.
Figure 3:
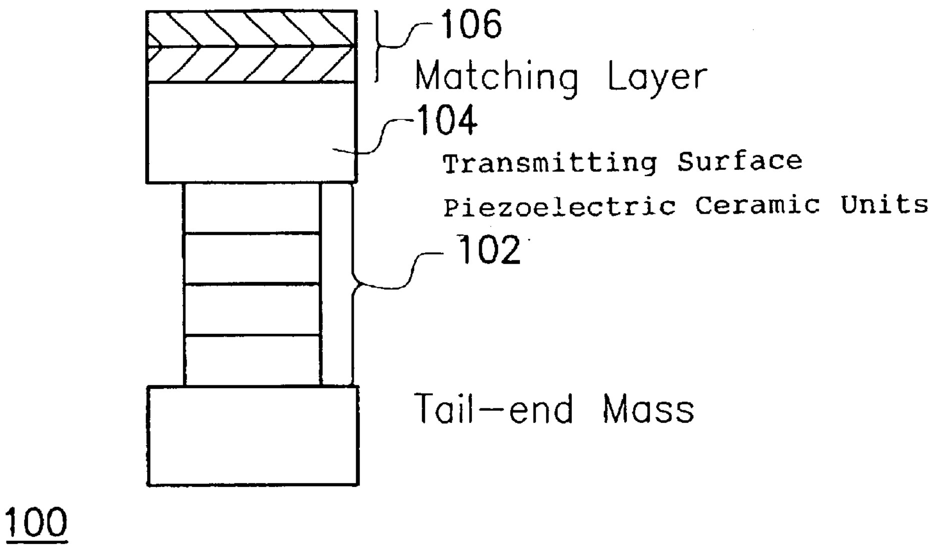
FIG. 3 (PRIOR ART)
FIG. 3 is a schematic diagram showing the side view of a conventional tonpilz-shaped transducer having a matching layer thereon.
Figure 4:
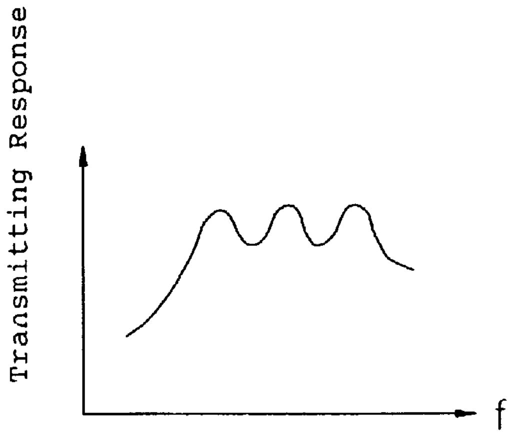
FIG. 4 (PRIOR ART)
FIG. 4 is a graph showing the frequency response of the transducer shown in FIG. 3.

Reference will now be made in detail to the present preferred embodiments of the invention, examples of which are illustrated in the accompanying drawings. Wherever possible, the same reference numbers are used in the drawings and the description to refer to the same or like parts.

Figure 5:
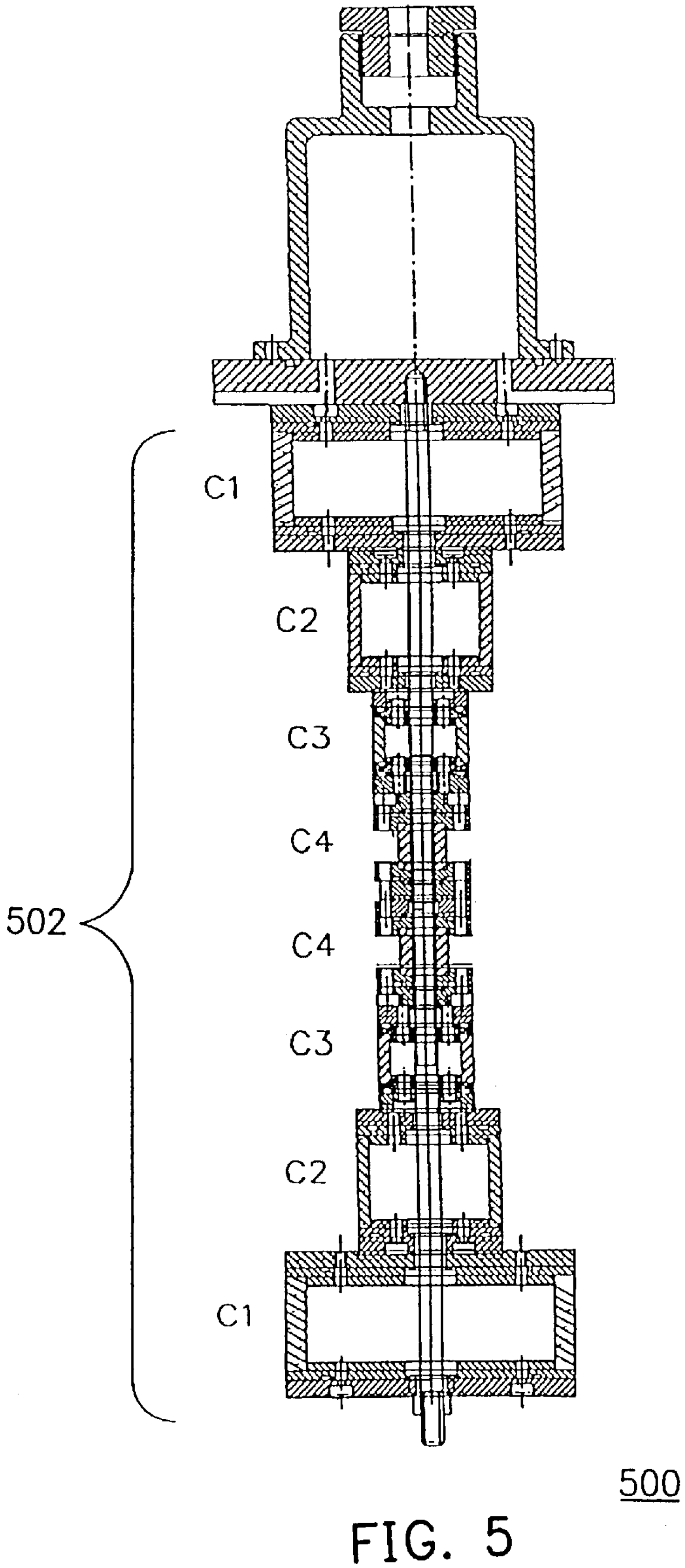
FIG. 5 is a schematic diagram showing the side view of an underwater wide-band electroacoustic transducer according to this invention.

FIG. 5 is a schematic diagram showing the side view of an underwater wide-band electroacoustic transducer according to this invention. The underwater wide-band electroacoustic transducer 500 comprises of several groups of piezoelectric ceramic units 502 (indicated as C1, C2, C3 and C4 in FIG. 5, i.e. four groups of piezoelectric ceramic units) and acoustic window material (not shown). Each group of piezoelectric ceramic units 502 has a different dimension and a different distance of separation from each other. The frequency response of these four groups of piezoelectric ceramic units add up together to produce a wide bandwidth overall frequency response. The acoustic plastic compound is used as the material in an injection-molding operation for joining the four groups of piezoelectric ceramic units 502 together.

The number of groups of piezoelectric ceramic units 502 assembled to form an electroacoustic transducer depends on the frequency bandwidth and frequency range of the operation. In general, piezoelectric ceramic units with a larger dimension are used if a low frequency range is required (such as the piezoelectric ceramic units C1 in FIG. 5). As the desired frequency range increases, piezoelectric ceramic units with a smaller dimension are used (such as the piezoelectric ceramic units C3, C4 in FIG. 5). For hollow cylindrical piezoelectric ceramic unit 502 having different radius, length and distance of separation of each unit must be carefully matched. Typically, the longer the ceramic unit, the stronger will be the transmitting strength. By adjusting the distance of separation between different ceramic units, various piezoelectric ceramic units 502 may be triggered in phase altogether. In addition, the greater the number of piezoelectric ceramic units used, the smoother will be the frequency response of the underwater wide-band electroacoustic transducer 500.

The acoustic window material is a type of PU plastic having an acoustic property ρc very close to water. To package the transducer, the assembled underwater wide-band electroacoustic transducer 500 is placed inside a mold (not shown). The mold is put inside a baking oven (not shown) and pre-heated to a temperature slightly higher than the injection temperature of the PU plastic. Before PU plastic injection, the mold is taken out from the baking oven into a vacuum chamber. After air is evacuated inside the vacuum chamber, PU plastic is injected into the mold. Thereafter, the entire mold together with the underwater wide-band electroacoustic transducer 500 inside is transferred to the baking oven for aging. This type of PU plastic injection is able to avoid any damage to the piezoelectric ceramic units due to the application of pressure to compress the rubber in a conventional assembly process.

An electroacoustic transducer having a single group of piezoelectric ceramic units has the highest transmitting response at the resonance frequency while the response below the resonance frequency drops at 12 db/octave towards the low frequency range. Similarly, response above the resonance frequency also drops. According to acoustic field theory, overall frequency response of an electroacoustic transducer array is the result of acoustic transmitting from various groups at a free far field region. Hence, when several groups piezoelectric ceramic units each having a different dimension are assembled to form the electroacoustic transducer, several groups of resonance frequency are produced. Ultimately, a wide bandwidth frequency response is created.

The transmitting response of an electroacoustic transducer may be computed from the following formula:

$$TVR = 10 \log G_P + 10 \log \eta + DI + 170.8 \text{ dB}//\mu\text{Pa}/V@1 \text{ m}$$

where TVR is the transmitting response, $G_P$ is the parallel conductance of the electroacoustic transducer, η is the efficiency of the electroacoustic transducer, DI is a directionality index, and the value of $G_P$, η and DI are obtained from an equivalent circuit of the electroacoustic transducer through multiplication and addition theory.

Figure 6:
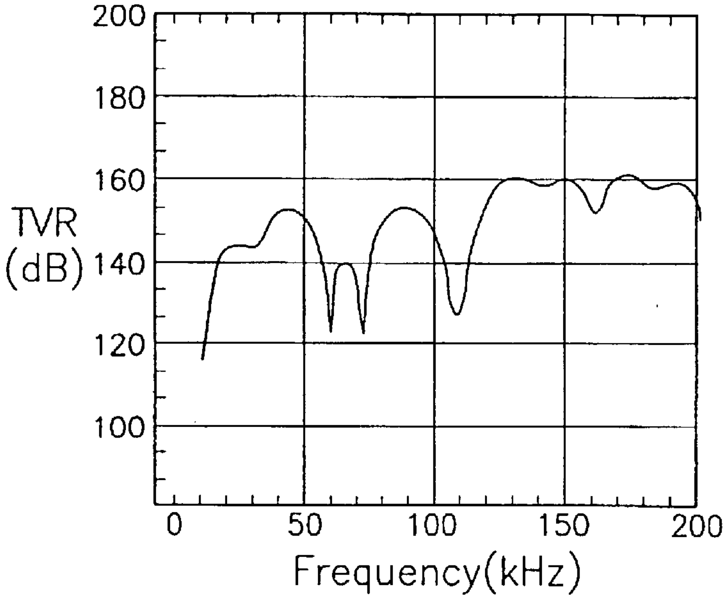
FIG. 6 is a graph showing the simulated transmitting response of an electroacoustic transducer having four groups of piezoelectric ceramic units.

To conduct a simulation of the proposed electroacoustic transducer, product specifications of common piezoelectric ceramic unit manufacturers are used. Four groups of piezoelectric ceramic units each having a different dimension are selected. Each group uses two piezoelectric ceramic units coupled together to form even terminal. FIG. 5 is a schematic diagram showing the side view of an underwater wide-band electroacoustic transducer according to this invention. FIG. 6 is a graph showing the simulated transmitting response of an electroacoustic transducer having four groups of piezoelectric ceramic units. In FIG. 6, simulation result from a frequency of 5 kHz to 200 kHz is shown.

Figure 7:
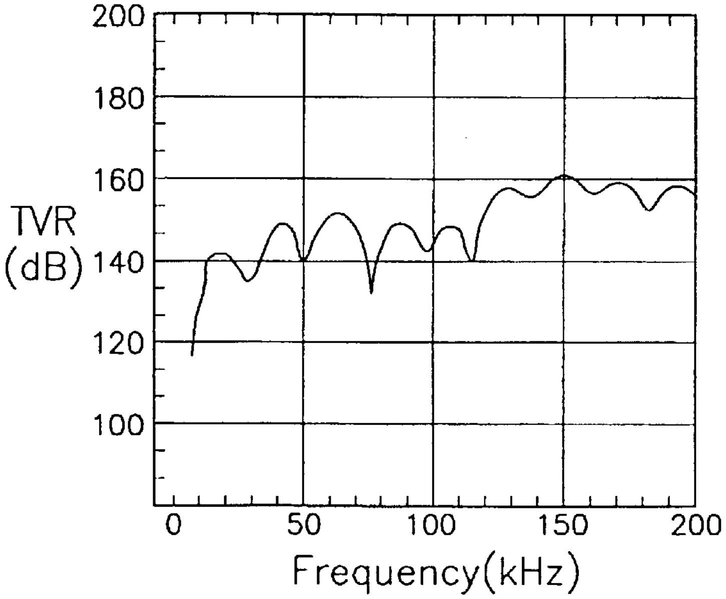
FIG. 7 is a graph showing the simulated transmitting response of an electroacoustic transducer having three groups of piezoelectric ceramic units.

If the group C2 in the four groups of piezoelectric ceramic units is removed (refer to FIG. 5) so that the remaining groups C1, C3 and C4 are still coupled in parallel, the results of transmitting response simulation is shown in FIG. 7. As shown in FIG. 7, the removal of one group of piezoelectric ceramic units from the transducer results in a drop in transmitting response at the low frequency range. However, the variation of transmitting response is due to the closeness of resonance frequency between the group of ceramic units C2 and the group of ceramic units C3 while a portion of the frequency response produces destructive interference.

Figure 8:
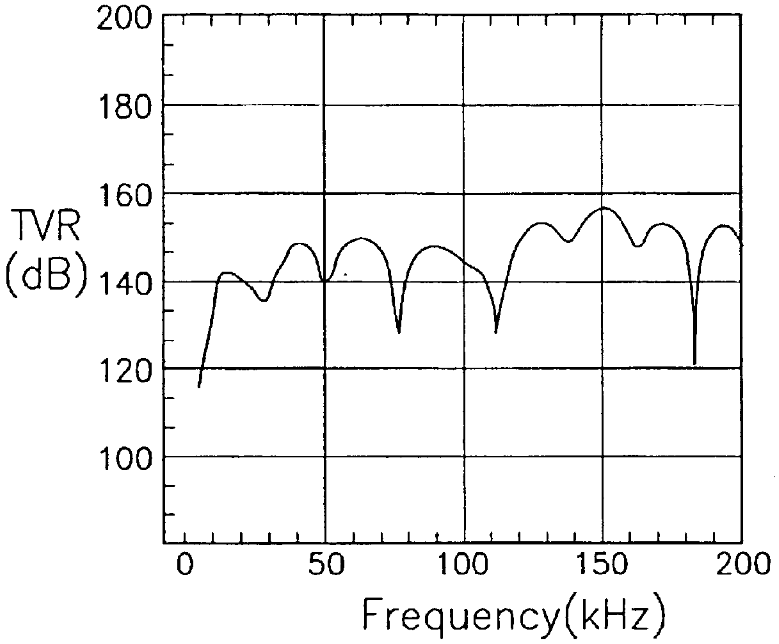
FIG. 8 is a graph showing the simulated transmitting response of an electroacoustic transducer having three groups of piezoelectric ceramic units altogether but with one group of piezoelectric ceramic units having a dimension only half of the remaining groups.

If the length of the C4 group of piezoelectric ceramic unit is reduced by half and joined in parallel to the C1 and the C2 group of piezoelectric ceramic units to form a three group assembly, an transmitting response simulation of the assembly is shown in FIG. 8. Compared with the frequency response graph in FIG. 7, the reduction of the length of the C4 group of piezoelectric ceramic units by half leads to a drop of the transmitting response at the high frequency range and produces a droop in the mid-portion of the frequency response curve.

Figure 9:
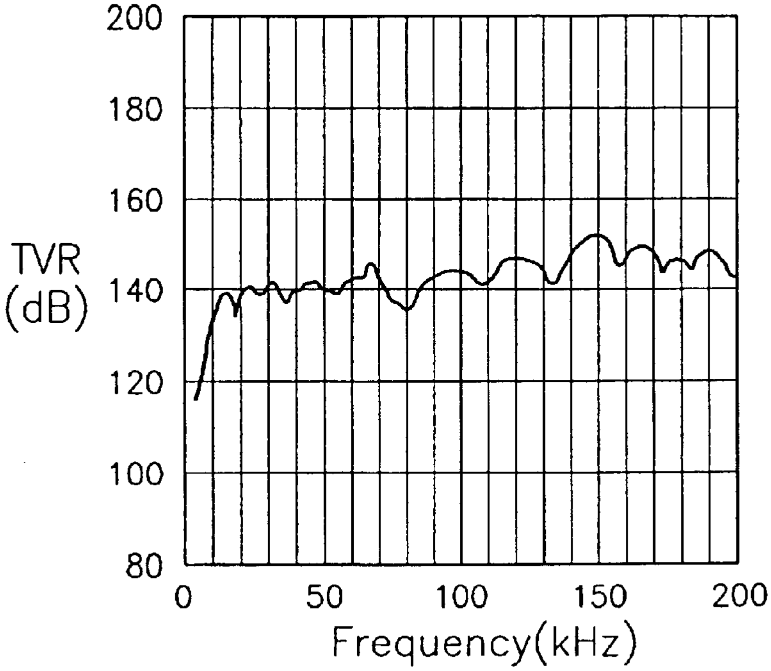
FIG. 9 is a graph showing the actual transmitting response obtained by testing an electroacoustic transducer having four-group piezoelectric ceramic units and fabricated according to this invention.

The semi-finished electroacoustic transducer having four groups of piezoelectric ceramic units therein is placed inside a set of mold. The mold is preheated inside a baking oven. Thereafter, the mold is put inside a vacuum chamber where air is evacuated. Special PU plastic is injected into the mold and then transferred to the baking oven for aging. FIG. 9 is a graph showing the actual transmitting response obtained by testing an electroacoustic transducer having four-group piezoelectric ceramic units and fabricated according to this invention. As shown in FIG. 9, the transmitting response is relatively stable and smooth.

In this invention, several groups piezoelectric ceramic units are joined together to form an electroacoustic transducer. By selecting suitable dimension for the piezoelectric ceramic units and appropriate distance of separation between neighboring units, frequency response of the transducer can be adjusted. Ultimately, an electroacoustic transducer having a wide operating bandwidth is produced. This type of electroacoustic transducer, aside from serving as a wide bandwidth acoustic source, may also serve as a source of wide bandwidth noise for underwater electronic signal.

In conclusion, this invention uses several groups of piezoelectric ceramic units to produce an electroacoustic transducer capable of operating within a wide frequency range. Another advantage of this invention is the assemblage of various piezoelectric ceramic units together to form the electroacoustic transducer by injecting an acoustic plastic compound into a mold. In so doing, a flat and stable transmitting response is obtained and damages to the piezoelectric ceramic units due to a pressure assembly process are greatly minimized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of packaging an underwater wide-band electroacoustic transducer, wherein the underwater wide-band electroacoustic transducer comprises of a plurality of groups of piezoelectric ceramic units and an acoustic window material, the assembling and packaging method includes the following steps:

assembling several groups of piezoelectric ceramic units with the ceramic units in each group having a different dimension and a different distance of separation from each other such that the different frequency response provided by each group are banded together to form a wide bandwidth frequency response; and enclosing the piezoelectric ceramic units with the acoustic window material through a mold injection.

2. The packaging method of claim 1, wherein the piezoelectric ceramic units in each group have a hollow cylindrical shape and the piezoelectric ceramic units in each group has a different radius.

3. The packaging method of claim 1, wherein piezoelectric ceramic units with a larger dimension are selected to obtain a resonance frequency at a lower frequency rang and piezoelectric units with a smaller dimension are selected to obtain a resonance frequency at a higher frequency range.

4. The packaging method of claim 1, wherein the process of injecting acoustic window material to package the piezoelectric ceramic units includes the sub-steps of:

placing the underwater wide-band electroacoustic transducer inside a set of mold;

preheating the mold to a temperature slightly higher than the temperature for mold injection of the acoustic plastic:

putting the set of mold inside a vacuum chamber and evacuated air inside of the chamber;

injecting acoustic plastic into the mold; and heating the entire mold to age the injected acoustic plastic.

5. The packaging method of claim 1, wherein the acoustic window material includes a PU plastic compound having an acoustic property ρc very close to that of the water and an equivalent mass that produces a smooth transmitting response curve for the underwater wide-band electroacoustic transducer.

* * * * *